United States Patent [19]

Tarui et al.

[11] 4,046,594

[45] Sept. 6, 1977

[54] SOLAR BATTERY

[75] Inventors: Yasuo Tarui, Higashi-Kurume; Tsunenori Sakamoto; Yoshio Komiya, both of Tonashi, all of Japan

[73] Assignee: Agency of Industrial Science & Technology, Tokyo, Japan

[21] Appl. No.: 670,756

[22] Filed: Mar. 26, 1976

[30] Foreign Application Priority Data

June 19, 1975 Japan .............................. 50-73658

[51] Int. Cl.$^2$ .............................................. H01L 31/06
[52] U.S. Cl. ................................. 136/89 SJ; 29/572;
136/89 CC; 156/662; 357/30; 357/55
[58] Field of Search ....................... 136/89; 357/30, 55

[56] References Cited

U.S. PATENT DOCUMENTS

| 3,015,762 | 1/1962 | Shockley | 136/89 X |
| 3,150,999 | 9/1964 | Rudenberg et al. | 136/89 |
| 3,152,926 | 10/1964 | Power | 136/89 |
| 3,186,873 | 6/1965 | Dunlap, Jr. | 136/89 |
| 3,422,527 | 1/1969 | Gault | 29/572 |
| 3,585,714 | 6/1971 | Li | 29/580 |
| 3,653,971 | 4/1972 | Lidorenko et al. | 136/89 |
| 3,682,708 | 8/1972 | Bennett | 136/89 |

Primary Examiner—John H. Mack
Assistant Examiner—Aaron Weisstuch
Attorney, Agent, or Firm—Oblon, Fisher, Spivak, McClelland & Maier

[57] ABSTRACT

Disclosed is a solar battery comprising a multi-layered "p-n" junction structure, which has a plurality of inwardly converging recesses to partially expose the inner "p-n" junctions to the sun light.

6 Claims, 5 Drawing Figures

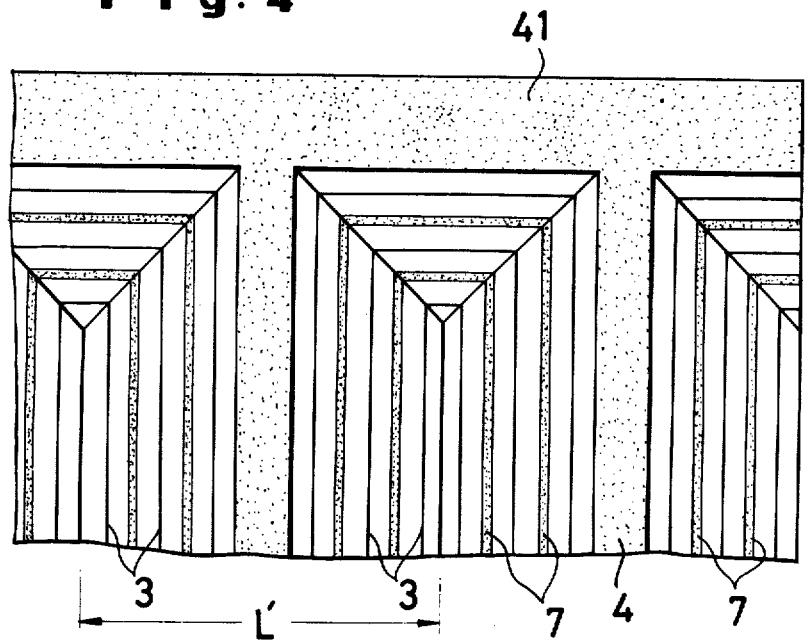
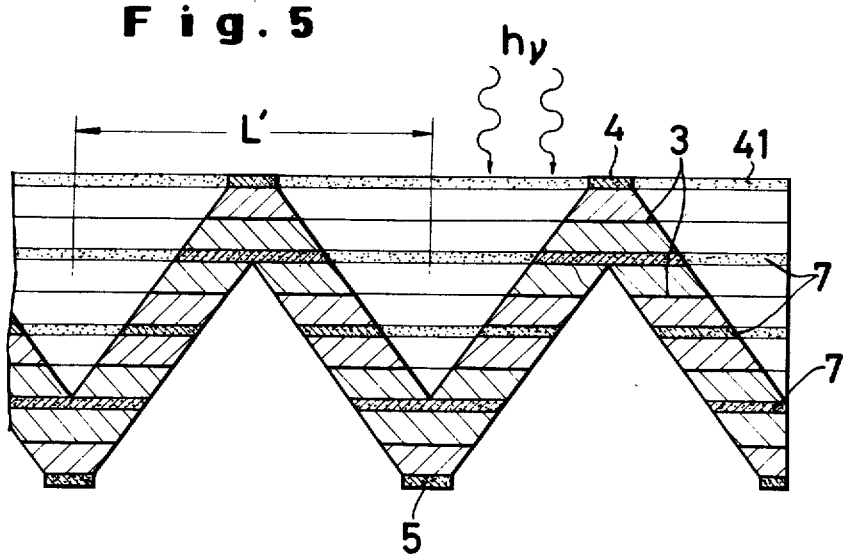

SOLAR BATTERY

BACKGROUND OF THE INVENTION

This invention relates to a solar battery, and particularly to a solar battery which is composed of a semiconductor having "p-n" junctions provided in the form of multi-lamination.

As a result of the recent energy shortage, an energy source other than petroleum has been sought, and interest has increased in the use of solar energy, which is available in infinitely great amounts and is non polluting. As a means for converting solar energy to electric energy, a solar battery was invented in 1954 and the battery has been continuously studied from the practical point of view. However, the practical use of the solar battery has been limited only to artificial satellites or unmanned lighthouses. This relatively narrow application of the solar battery is attributable to its high cost which makes it non-competitive with commercially available electric power. Therefore, the enlargement of application of solar batteries will be impossible unless the production cost of semiconductor materials can be reduced.

And at the same time, it will be necessary to raise the solar-to-electric energy conversion efficiency, to extend the life, and to increase the reliability of solar batteries before they can attain practical usage in a wide range of industries.

Increasing the electric power obtainable from a solar battery is of primary importance. The generation rate G of hole-electron pairs in a semiconductor when exposed to a monochromatic light, is given by the following equation:

$$G(x) = \alpha(\lambda)\Phi_0(\lambda)\exp(-\alpha x) \qquad (1)$$

where $\alpha(\lambda)$ is the absorption coefficient [cm$^{-1}$]; $\Phi_0(\lambda)$ is the injection light flux density [cm$^{-2}$S$^{-1}$] and "x" is the distance measured from the surface of the semiconductor body on which the monochromatic light falls.

Only those electron-hole pairs which appear within a diffusion length from the junction region are available for producing electric power. As a result of absorption of the light penetrating into the superficial depth of a semiconductor body, electron-hole pairs appear, but a part of those electron-hole pairs will disappear at recombination centers in the surface of the semiconductor body, and those electron-hole pairs which appear in a relatively deep part of the semiconductor body will be recombined, and will disappear before they reach the "p-n" junction. In view of this, the conventional solar battery having a single "p-n" junction lying in the traverse direction to the incident light, is structually disadvantageous, and is less efficient in the conversion of the solar energy to electric energy.

The output voltage of a unijunction solar battery depends on the Fermi levels of the "N" and "P" type semiconductor, which compose the "P-N" junction and therefore the use of a semiconductor of high impurity concentration is effective in raising the output voltage of the solar battery. In this case, however, the diffusion length of the excess minority carriers is disadvantageously shortened, and accordingly the efficiency is lowered. In the hope of solving this problem a series-connection of unijunction semiconductor elements and a pile of "p-n" junction semiconductor elements have been hitherto proposed. The pile of "p-n" junction elements are so constructed as to expose the multi-layer side thereof to the light. As a modification thereof, a plurality of "p-n" elements of decreasing dimensions are piled up so as to constitute a plateau.

As seen from the above, the solar batteries hitherto proposed have a complicated structure, and they work at a low efficiency.

The object of this invention is to provide a solar battery of homoepitaxial or heteroepitaxial multi-layered structure of semiconductors which is easy to produce and works at an increased efficiency of solar-to-electric energy conversion.

SUMMARY OF THE INVENTION

To attain this object a solar battery according to this invention comprises a pile of active layers, each being composed of a "p-n" junction semiconductor element and a coextensive electrode, said semiconductor elements and electrodes being so shaped and dimensioned as to expose the side of each layer to the light falling on the multi-laminated structure, thus converting the solar energy to electric power at an increased efficiency.

The solar battery according to this invention can be produced by selective-etching of V-shaped slots in an epitaxially grown semiconductor.

BRIEF EXPLANATION OF THE DRAWINGS

Other objects and advantages of this invention will be understood from the following description of preferred embodiments which are shown in accompanying drawings:

FIG. 4 is a plane view of the first embodiment as shown in FIG. 3; and,

FIG. 5 shows, in section, another embodiment according to this invention.

DESCRIPTION OF THE PREFERRED EMBODIMENTS

Figure 1:
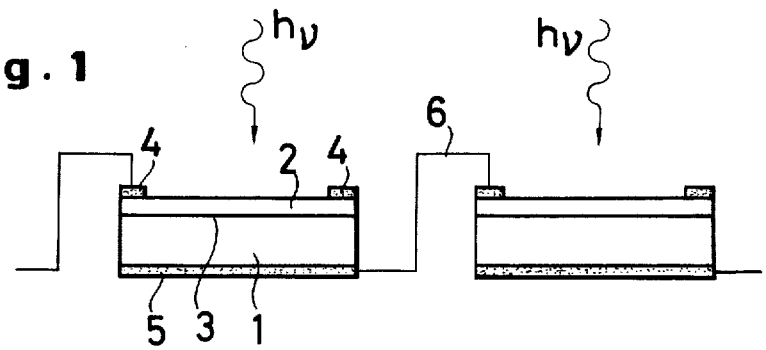
FIG. 1 shows a conventional series-connection of unijunction semiconductor solar cells.

FIG. 1 shows a conventional series-connection of unijunction semiconductor solar cells. As shown in this drawing, an n type (or p type) semiconductor 1 is connected to a p type (or n type) semiconductor 2, and ohmic-electrodes 4 and 5 are attached to the opposite surfaces of the composite unit. A plurality of solar cells are series-connected by connecting the base electrode 5 of a solar cell to the top electrode 4 of a subsequent solar cell by means of lead wire 6. 3 is a "p-n" junction plane.

In a series-connection of solar cells an electric resistance which appears in the direction perpendicular to the direction of electromotive force (parallel to the "p-n" junction plane) is inserted at each "p-n" junction, and if the impurity concentration of the overlying layer (which is to be exposed to the light) is raised, or if the thickness of the overlying layer is increased to lower such series resistance, the absorption by the overlying layer of the incident light will be adversely affected, and therefore the above remedy to reduce the series-resistance is in some degree self-defeating.

Figure 2:
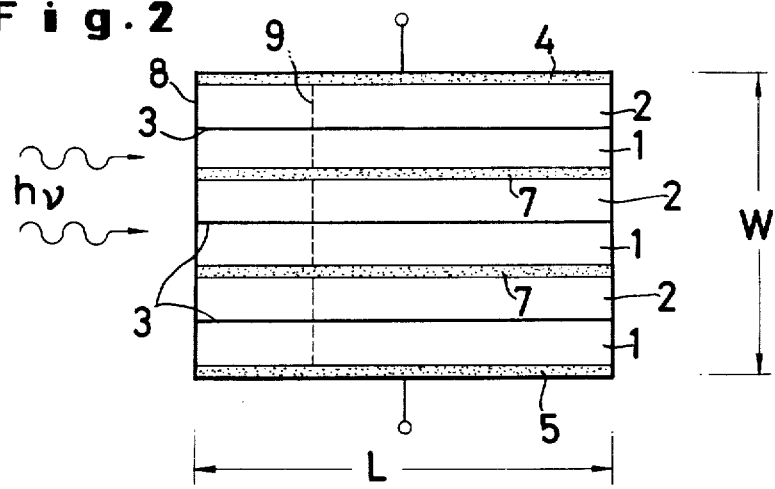
FIG. 2 shows, in section, a conventional multi-laminated type solar battery.

With a view to improving the absorption of light and at the same time to lowering the electric resistance of the composite structure, a solar battery of vertical multi-junction structure as shown in FIG. 2 has been proposed. The composite structure shown is comprised of three "p-n" junctions. In this drawing, 7 is a metal ohmic contact (or P++ N++ tunnel junction), and 8 is the side of the composite structure on which the light falls. 9 is an effective light-absorption length which is measured from the light-incident side of the semiconductor device. Each "p-n" junction is made in a metal foil-sandwiching form. Otherwise, it is made in the arrangement of PNP++N++PN.

Thanks to the unique structure, if the whole side of the vertical multi-junction device is exposed to the light, the light falls on every "p-n" junction, and accordingly an increased voltage output results. In a conventional unijunction device, there is a tendency for the sunlight-to-electric conversion efficiency to lower if the sunlight intensity rises beyond 1 sun. Compared with this, the light-to-electric conversion efficiency of the vertical multi-junction device remains at an elevated value beyond 50 suns. According to Rahilly's estimation, a vertical multi-junction device having 1000 or more cells will have a light-to-electric conversion efficiency twice as great as that of a unijunction device of the same surface area, and still advantageously the vertical multi-junction device has good resistivity to radiant rays. Disadvantageously, the whole amount of the penetrating sun light is absorbed within a relative shallow depth from the surface of the device. For instance, 80 to 90 percent of the sunlight is absorbed within a 10 micron depth in a silicon vertical multi-junction device. Generally, a compound semiconductor has an even shorter absorbing length. Judging from the thickness of a vertical multi-junction device, which is made for instance by epitaxial growth, and judging from the light-absorbing length as mentioned above, it is supposed that the sunlight cannot invade a large enough number of "p-n" junctions to produce an increased voltage output if the sun light falls on the vertical multi-junction device in the direction perpendicular to the "p-n" junction. Assume that the sun light $h\nu$ falls on the vertical multi-junction device in the direction parallel to the "p-n" junction. In FIG. 2, the dimension L of the device becomes naturally great in the course of crystal growth, and if the light $h\nu$ falls on one whole side of the device, the incident light will be absorbed before it reaches the depth indicated by broken line 9. The right part of the device with regard to the broken line does not contribute to generation of electric power. This useless part adversely constitutes a load to the electromotive force, thus causing a dark leak current to flow in this part of the device. Therefore, it is necessary to shorten the length L of the device as much as possible. This necessitates the precise cutting of a crystal.

The "I-V" characteristics of a "p-n" junction element when exposed to the light are given by:

$$I = I_L - I_S(\exp(qV/kT) - 1) \quad (2)$$

where $I_L$ is the electric current caused by photo-excitation, and $I_S$ is a reverse saturated current, which is given by:

$$I_S = qni[1/N_A(D_n/\tau_n)^{\frac{1}{2}} + 1/N_D(D_p/\tau_p)^{\frac{1}{2}}] \quad (3)$$

By substituting zero for I in the equation (2), the open voltage $V_{max}$ is given by:

$$V_{max} = kT/q \ln(I_L/I_S + 1) \quad (4)$$

The equations (2), (3) and (4) imply that: the voltage output will be increased by increasing the electric current $I_L$ due to the photo-excitation and at the same time by decreasing the reverse saturated current $I_S$. $I_S$ can be reduced by increasing the impurity concentrations $N_A$ and $N_D$ as is apparent from the equation (3), but the increase of the impurity concentrations will adversely cause the shortening of the life times $\tau_n$ and $\tau_p$. Whether the semiconductor device is exposed to the light or not, the current $I_S$ usually flows within the device, and therefore it is better to remove the part of the device which the incident light does not reach.

In FIG. 2, the vertical dimension W perpendicular to the "p-n" junction is the direction in which a crystal grows, and therefore it is difficult to increase the vertical dimension of the device. For instance, if 100 "p-n" junctions, each being one micron thick, are series-connected, the total vertical dimension is as small as one hundred microns.

In view of the fact that the solar battery should make full use of the sunlight, it is preferable that it be composed of an extensive and close arrangement of numerous cells without leaving any space between adjacent cells. From the minuteness of each cell it is apparent that such extensive and close arrangement of numerous cells is tedious work.

The object of this invention is to provide a solar battery which is free from the disadvantages mentioned above, and to attain this object a solar battery according to this invention comprises a homoepitaxial or heteroepitaxial semiconductor of multi-layered structure of "p-n" junction, which structure has at least one V-shaped recess at a selected portion on the top of the structure to partially expose the inner "p-n" junctions of the device, thus enlarging the total area of the "p-n" junctions to be exposed to the light.

Figure 3:
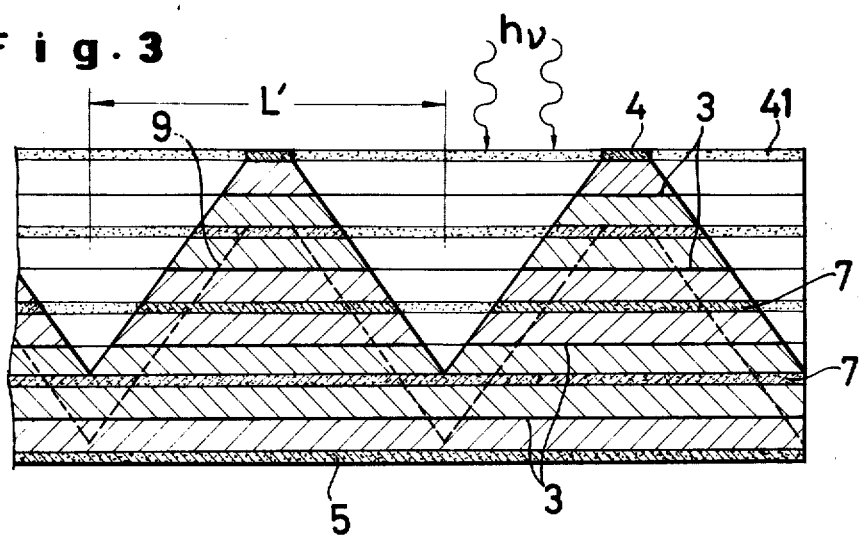
FIG. 3 shows, in section, an embodiment according to this invention.

Preferred embodiments according to this invention will be described hereinafter with reference to FIGS. 3, 4 and 5. For the sake of simplicity, every embodiment is shown as comprising four layers, but this figure should not be understood to be limitative, and this invention is equally applicable to a semiconductor device having five or more "p-n" junction layers. In FIGS. 3, 4 and 5 are ohmic electrodes to connect the semiconductor device to an exterior circuit, and 7 is an inner ohmic contact to series-connect adjacent "p-n" junctions. One of the methods for making the ohmic contact is in the form of N++ and P++, and a plurality of layers of different conductivity types are put on each other in the order of PNP++N++PN. The tunnel current flows through this P++N++ junction, thus causing this part to function as an ohmic contact between adjacent "p-n" junctions. A similar effect will be caused by using gold, copper and other life time killers in the "p-n" junction region instead of the above P++N++ tunnel junction, thereby causing the "p-n" junction to be made leaky due to the large generation recombination current. One other method to obtain the ohmic contact is, as will be described in more detail later, to use the metal layer for the inner ohmic contact using heteroepitaxial multi-layered structure such as a GaAs-Al-GaAs-Al-GaAs. The incident light is absorbed before it reaches the broken line 9 in FIG. 3. Thus, the length to the broken line is called the light absorbing length. FIG. 4 shows the semiconductor device as seen in the direction in which the light falls on the device. The top ohmic contact 4 is connected to a connection means 41. As best shown in FIG. 3, the exposed planes of etched groove on which the sun light falls is inclined to the "p-n" junction planes. This V-shaped recess can be easily made by selective etching. Specically, in selective etching of a silicon body, an etching solution of $H_2O$:8ml plus ethylenediamine [$NH_2(CH_2)_2NH_2$]: 17ml plus pyrocratecol [$C_6H_4(OH)_2$]:3g is advantageously used. The etching rate of this solution to "planes {100}" is twenty times as much as the etching rate to "planes {111 }". A PNP++N++PN epitaxial-grown on {100} substrate is partially covered by an $SiO_2$ mask, and the so-masked, multi-layered structure is subjected to etching, using the above mentioned etching solution. Planes {111} which are inclined at about 54.7° as shown in FIG. 3 will result. Relying on this technique the exact and same V-shaped recess can be reproduced on different semiconductor devices. According to another embodiment of this invention GaAs is used as the semiconductor material. Esaki et al have succeeded in composing a stack of single crystal GaAs layers and single crystal Al layers alternately lying on each other, using the molecular beam epitaxial method. (L. Esaki, et al., Appl. Phys. Lett. Vol. 23, No. 4, 15 August (1973). Using this molecular beam method, it is possible to produce a stack of GaAs "p-n" junctions wherein each PN junction is sandwiched by heteroepitaxially grown aluminum layers. In accordance with this invention, the GaAs single crystals in such a stack can also selectively etched to form V-shaped grooves inclined at 54.7° by using, for example, $Br_2$-$CH_3OH$ system where etching rates for A {111} planes are slower than for other low index planes. (Y. Tarui et al, J.E.C.S. Vol. 118, No. 1, 118 (1971). As for the specific structure shown in FIG. 3, if 100 "p-n" junction laminations each 1 micron thick, are laid on each other, and if the top electrode 4 is 10 microns long, the length L' of the "p-n" junction in the vicinity of the bottom will be about 150 microns long.

In FIG. 3, a plurality of plateaus are arranged at every distance L', and they are of monolithic integration. These plateaus can be exactly produced by a single selective etching of the whole area of the initial wafer, and therefore manual arranagement of numerous separate cells is not required.

FIG. 5 shows another embodiment according to this invention. The zig-zag structure as shown is produced by applying the selective etching to the opposite surfaces of the multi-layered semiconductor body and by reducing the thickness of the laminated body to one which is adequate to absorb the incident sun light. In this structure there are few parts into which the sun light does not penetrate, and accordingly there appears no reverse saturated dark current, and hence no loss of electric energy which otherwise would be caused by the reverse saturated dark current. Thus, this zig-zag solar battery works at an increased efficiency.

As mentioned above, according to this invention a conventional vertical multi-junction structure is modified by selective-etching the multi-layered body to partially expose the inner "p-n" junctions thereof, thus providing a high efficiency solar battery which makes full use of the laminated structure.

The embodiments above described are shown as having V-shaped recesses, but this particular shape should not be understood to be limitative. The recess may have any other shape which is proper for partially exposing the inner "p-n" junctions of the semiconductor body.

What is claimed is:

1. A solar battery of homoepitaxial or heteroepitaxial structure comprising a series connected stack of alternately arranged planar layers of $p$ and $n$ semiconductor material, each pair of adjacent layers of opposite conducting type forming a photovoltaic junction therebetween, each said junction being parallel to the plane of the layers, with ohmic electrodes lying between each said pair, said stack having top and bottom major surfaces and a plurality of grooves in the top major surface of said stack, said grooves extending through said planes of the said junctions, the exposed surfaces of said grooves being inclined to said junction planes for receiving impinging radiation.

2. A solar battery according to claim 1 wherein said stack has a plurality of grooves in the bottom major surface of said stack and extending through said planes of said junctions, the exposed surfaces of said grooves in the bottom surface of said stack being inclined to said junction planes, the grooves in the top surface of said stack and the grooves in the bottom surface of said stack thereby providing a zig-zag appearance in longitudinal section.

3. A solar battery of homoepitaxial or heteroepitaxial structure comprising a series connected stack of alternately arranged planar layers of $p$ and $n$ semiconductor material, each pair of adjacent layers of opposite conductivity type forming a photovoltaic junction therebetween, each said junction being parallel to the plane of the layers, with inner ohmic electrodes lying between each said pair, said stack having top and bottom major surfaces and a plurality of converging recesses in said top major surface of the stack and extending through the planes of said junctions to partially expose the junctions.

4. A solar battery according to claim 3 wherein said converging recesses are of the form of V-shaped notches.

5. A solar battery according to claim 4 wherein said inner ohmic electrodes are composed of P++N++ tunnel junctions.

6. A solar battery according to claim 3 wherein said inner ohmic electrodes are composed of metal layers formed by a heteroeitaxial method.

* * * * *